(12) United States Patent
Hegedus

(10) Patent No.: US 7,279,657 B2
(45) Date of Patent: Oct. 9, 2007

(54) SCANNED RAPID THERMAL PROCESSING WITH FEED FORWARD CONTROL

(75) Inventor: Andreas G. Hegedus, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/151,879

(22) Filed: Jun. 13, 2005

(65) Prior Publication Data

US 2006/0289504 A1    Dec. 28, 2006

(51) Int. Cl.
*B23K 26/06* (2006.01)
*B23K 26/08* (2006.01)

(52) U.S. Cl. .............. 219/121.73; 219/121.8
(58) Field of Classification Search .......... 219/704, 219/121.8, 121.73, 121.65, 121.74, 121.78, 219/121.79, 121.81–121.83; 356/239.8, 356/237.4, 237.5, 369; 257/E21.134, E21.101, 257/E21.102, E21.525
See application file for complete search history.

(56) References Cited

U.S. PATENT DOCUMENTS

| | | | |
|---|---|---|---|
| 5,254,830 A | 10/1993 | Zarowin et al. | 219/121.43 |
| 5,871,805 A | 2/1999 | Lemelson | 427/8 |
| 6,531,681 B1 | 3/2003 | Markle et al. | 219/121.8 |
| 6,885,444 B2* | 4/2005 | Borden et al. | 356/239.8 |
| 6,908,774 B2 | 6/2005 | Ghyselen et al. | 438/14 |
| 2003/0196995 A1* | 10/2003 | Jennings | 219/121.73 |
| 2003/0196996 A1 | 10/2003 | Jennings et al. | 219/121.73 |

* cited by examiner

*Primary Examiner*—Quang Van
(74) *Attorney, Agent, or Firm*—Law Office of Charles Guenzer

(57) ABSTRACT

A thermal processing system and method including scanning a line beam of intense radiation in a direction transverse to the line direction for thermally processing a wafer with a localized effectively pulsed beam of radiant energy. The thickness of the wafer is two-dimensionally mapped and the map is used to control the degree of thermal processing, for example, the intensity of radiation in the line beam to increase the uniformity. The processing may include selective etching of a pre-existing layer or depositing more material by chemical vapor deposition.

18 Claims, 3 Drawing Sheets

SCANNED RAPID THERMAL PROCESSING WITH FEED FORWARD CONTROL

FIELD OF THE INVENTION

The invention relates generally to thermal processing of semiconductor substrates. In particular, the invention relates to rapid thermal processing including scanning a beam of radiant energy across the substrate.

BACKGROUND ART

Rapid thermal processing (RTP) is a well developed technology for fabricating semiconductor integrated circuits in which the substrate, for example, a silicon wafer, is irradiated with high-intensity optical radiation to quickly heat the substrate to a relatively high temperature to thermally activate a process in the substrate. Once the substrate has been thermally processed, the radiant energy is removed and the substrate quickly cools. Thereby, the thermal budget is reduced because the RTP chamber itself is not heated to the elevated temperatures required for processing the substrate. RTP has been applied to a number of different applications including annealing, silicidation, oxidation and nitridation, etching, smoothing, and chemical vapor deposition as examples.

Conventionally RTP chambers have relied upon a large number of high-intensity lamps, for example, tungsten halogen lamps arranged in an array over a silicon wafer. The lamps can be quickly turned on and off, thereby achieving high thermal ramp-up and ramp-down rates on the wafer. However, advanced integrated circuits are demanding even quicker heating rates. Several laser-based RTP systems have been proposed in which a laser producing a relatively small beam is scanned over the surface of the wafer. In one type of scanned laser RTP system, 20 ns of pulsed laser radiation is directed to different small areas of the wafer. The high-intensity pulsed radiation very quickly heats the surface of the localized area to a high temperature without significantly heating the supporting substrate.

Another approach generates a narrow line beam of CW laser radiation which is scanned across the wafer in a direction transverse to the line. Thereby, the laser radiation strikes a particular area only for a relatively short time. Scanning of a linear CW beam thus also produces very high thermal heating rates of the surface without significantly heating the supporting substrate. The linear beam also inherently provides better uniformity than the pulsed spot beams characteristic of high-energy pulsed lasers. Jennings et al. describes such a scanned line beam in U.S. Published Application 2003/0196996, incorporated herein by reference in its entirety. Markle et al. disclose another type of such apparatus in U.S. Pat. No. 6,531,681.

Uniformity becomes a continuingly more stringent requirement for advanced integrated circuits. Non-uniformities may arise from present processing conditions or from prior stages of fabrication. Most processing, including RTP, assumes that the wafer being processed is substantially uniform on a macroscopic basis and the control system attempts to make the current process as uniform as possible. In any case, any improvement in uniformity simplifies the design of the integrated circuit and increases the fabrication yield.

Some types of processing afford control over radial profiles. For example, in rapid thermal processing (RTP), an array of high-intensity lamps is directed at a spinning wafer. The wafer rotation substantially guarantees circumferential uniformity of thermal processing. Several pyrometers or other temperature measuring devices are directed at different radii of the wafer and the lamp array is divided into multiple radial heating zones which are separately controlled. In typical operation, the amount of power delivered to the different heating zones is varied to provide a uniform temperature profile. In some situations, the heating control may be used to provide a radially non-uniform temperature profile. For example, in feed back control, one or more test wafers are thermally processed according to a set recipe and then characterized for any radial non-uniformity. The recipe for processing of future wafers is then modified with an adjusted radial heating pattern which reduces the observed radial non-uniformity. Similar feed back radial control has been practiced in chemical mechanical polishing (CMP) in which wafer rotation provides circumferential uniformity and a the radial pressure profile is adjusted to correct non-uniformities observed on test wafers.

Such feed back control suffers several disadvantages. First, it is substantially incapable of correcting a two-dimensional variation in uniformity, particularly when the non-uniformity arises in a previous step in which the wafer is not rotated to provide circumferential uniformity. Secondly, it assumes that any non-uniformities are not varying in time or from wafer to wafer.

Although the invention is not so limited, one technology area suffering from macroscopic non-uniformities involves silicon-on-insulator (SOI) wafers. SOI wafers are already applied to MEMS (micro electromechanical system) chips and are anticipated to be used in very advanced silicon integrated circuits. An SOI wafer 10, illustrated in cross section in FIG. 1, includes a silicon wafer 12 over which is deposited a dielectric layer 14, for examples, a silicon dioxide layer 14 deposited by CVD (chemical vapor deposition). A silicon layer 16 is then deposited over the dielectric layer 14 in another CVD process. The silicon layer 16 as deposited is typically polycrystalline. If desired, the polycrystalline silicon may be converted to monocrystalline silicon by techniques well known in SOI technology. The illustrated structure is usually formed in a blanket, unpatterned structure over an entire wafer.

In an alternative SOI technology, usually referred to as the Soitec process, heavy ions are implanted at a predetermined depth into a silicon donor wafer, which is then bonded to a silicon acceptor wafer with an oxide layer therebetween. The underlying donor wafer is then cleaved along the implantation line to leave a thin silicon surface layer overlying the oxide layer.

Standard semiconductor fabrication techniques, including CVD, sputtering, etching, and photolithography, are then used to form semiconductor or MEMS devices in and over the silicon layer 16. After the device definition, the SOI wafer 10 is diced into a number of integrated circuit chips. The SOI structure is particularly advantageous for semiconductor devices because the dielectric layer 14 insulates the devices from the silicon substrate 12 and thereby virtually eliminates leakage and parasitic capacitance between the devices and the substrate. However, device performance is enhanced if the silicon layer 16 is uniformly thick. Unfortunately, it often occurs that the as deposited silicon layer 16 has significant variations in thickness over lateral distances of many millimeters with an irregular pattern of peaks 17 and valleys 18 and these variations may vary in a two-dimensional pattern with no easily defined symmetry. Even a four-fold asymmetry is difficult to compensate. Although better process control may improve the thickness uniformity, it is desired to improve the thickness uniformity on already fabricated SOI wafers.

Accordingly, it is desired to provide a control system that affords greater and closer control especially in a thermal processing system.

SUMMARY OF THE INVENTION

An apparatus for thermally processing a substrate, for example, by etching, includes scanning an elongated beam across the wafer. The amount of radiation delivered to the wafer is determined by a measurement of a layer thickness prior to the processing. The processing may include an etching process which selectively etches the measured layer to produce a more uniform thickness. The processing may include chemical vapor deposition of an additional layer of the same or different composition as the measured layer.

The thickness measurement may be performed on a separate thickness measuring apparatus, such as a scanning ellipsometer, or the thickness measuring apparatus may be included on the thermal processing equipment.

The invention also includes various methods practiced on such apparatus. The methods include a thickness measurement on a separate apparatus for a feed forward control of the thermal process, an in-situ measurement of the thickness in the thermal processing chamber for either a separate thickness mapping, a real-time determination of the thickness prior to processing, or a post-processing determination of thickness for subsequent processing.

A broad aspect of the invention includes a two-dimensional scan of a thermal treatment beam over a substrate with the total radiant energy delivered to a position on the wafer being determined by a two-dimensional control table. Most directly, the intensity of a line beam is varied according to a two-dimensional processing map.

DETAILED DESCRIPTION OF THE PREFERRED EMBODIMENT

The invention provides feed forward control of thermal processing, particularly accounting for two-dimensional variation, in a thermal processing apparatus delivering a localized heat source to thermally activate the process. The invention relies upon controllably varying the radiant energy delivered to different portions of the substrate being subjected to a thermally activated process to control the degree of thermal processing. For example, if the incoming substrate has a spatially varying non-uniformity, the thermal process is spatially varied in a reciprocal manner to compensate for the non-uniformity.

Figure 1:
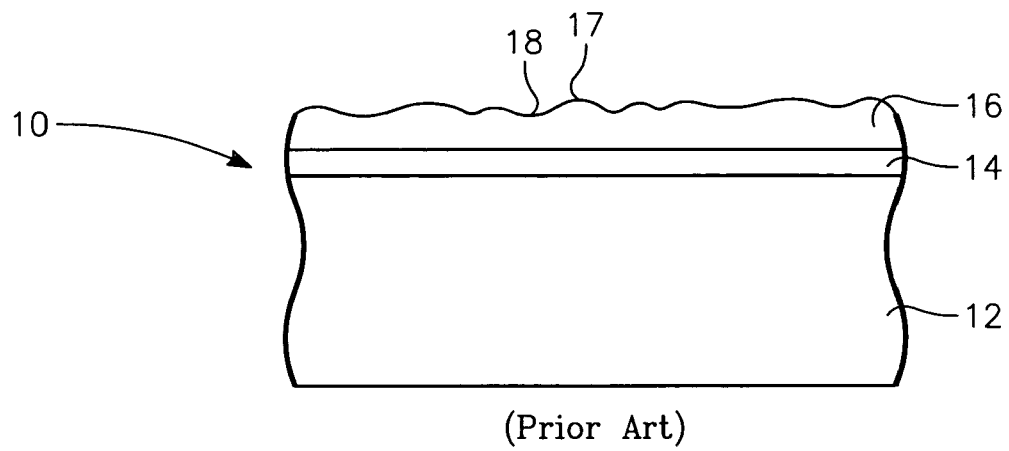
FIG. 1 is a cross-sectional view of a silicon-on-insulator wafer.

The invention may be practiced with different processes and substrate structures. Although the invention is not so limited, one beneficial application of the invention allows more uniform silicon layers to be formed in the previously described SOI (silicon on insulator) wafer. According to an exemplary method of practicing the invention, after the SOI wafer 10 of FIG. 1 has been formed, complete with its non-uniform silicon layer 16, the SOI wafer 10 is delivered to a feed forward measurement and etching system 20, illustrated in the schematic diagram of FIG. 2. The system 20 obtains a two-dimensional map of the thickness distribution of the silicon layer 10 over the entire surface of the wafer and uses the map to selectively etch different areas of the wafer to produce a more uniform thickness of the silicon layer 16. The wafer 10 with the silicon layer 16 is placed in a measuring apparatus capable of measuring a thickness map across the two-dimensional extent of the wafer 10. Such a measuring apparatus is a scanning ellipsometer 22, such as the Asset F5 available from KLA-Tencor. The wafer 10 is fixed in the ellipsometer 22 with a wafer alignment indicia 24, such as a notch, flat, or internal alignment marks aligned to known coordinates of the ellipsometer 22.

The ellipsometer 22 maps the thickness of the silicon layer 16 by well known techniques and stores the resultant map in a memory 26. The map includes both the thickness values as well as the two-dimensional positions on the wafer 10 for these thicknesses. Of course, the positions can be based on array indices in a well defined array of thickness values. The memory 26 may be a recordable medium, such as a removable disk, or it may be a hard disk or electronic memory incorporated into a computer.

The thickness map stored in the memory 26 is used to control the selective thinning of the silicon layer 16 of the wafer 10 in a scanning thermal treatment apparatus 30. Although illustrated as an integrated system The wafer 10 is transferred from the scanning ellipsometer 22 to an x-y, two-dimensional translation stage 32 of the of the thermal treatment apparatus 30 adapted for etching. It is advantageous for the stage 32 to additionally include a z-movement and also pitch and roll to control the focusing of the radiation beam. In brief, the thermal treatment apparatus 30 includes a laser source 34 of a heating beam 36 of electromagnetic radiation, such as a GaAs laser bar. Optics 38 shape and focus the laser beam into an elongated line beam 40 on the wafer surface, having a ratio of length to width of at least 5 and preferably at least 10, and in some applications much higher. It is understood that the axis of the heating beam 36 may be substantially inclined from the normal of the wafer 10 as it strikes the wafer 10, which advantageously increases optical coupling and reduces deleterious feedback to the laser source 34. The line beam 40 has a long dimension, for example, a millimeter or longer, and a short dimension, which may be less than 500 µm.

The wafer 10 is placed onto the stage 32 at a well defined position with its alignment indicia 24 pointing in a precise angle. Thereby, the location on the stage 32 or the translation of the stage 32 can be correlated with the two-dimensional locations of the thickness map stored in the memory 26. During thermal processing, a controller 42 controls an amount of power which a variable power supply 44 delivers to the laser source 34, hence controlling the intensity of the line beam 40, in accordance with the thickness map in the memory 26, in order to etch sufficient material in any location to reduce the thickness variation. Concurrently, the controller 42 controls the stage 32 to move the wafer 10 along the direction of the short dimension of the line beam 40. Alternatively, the wafer 10 may be placed on a stationary chuck and a translation mechanism associated with the optics 38 and laser source 34 moves the line beam 40 along its short dimension relative to the stationary wafer 10. The axis of this scan is often referred to as the fast axis. The narrow dimension of the line beam is small enough and the scan speed high enough that any position on the track being irradiated is exposed to a very short pulse of intense laser radiation. The pulse is so short that the heating extends a relatively small distance into the wafer 10. Thereby, the depth of thermal treatment can be controlled and reduced and the total thermal budget is reduced even if the same maximum surface temperature is achieved.

In the typical situation in which the long dimension of the line beam 40 is shorter than the diameter of the wafer 10 (currently planned line lengths are about 1 mm), after the line beam 40 has been scanned in one track across the wafer 10 in the fast axis, the stage 32 moves the wafer in the perpendicular direction, often referred to as the slow axis, to an adjacent track. Another fast axis scanned is performed on the new track. The alternating translations along the fast and slow axes are repeated until thermal treatment of the useful area of the wafer 10 is completed.

Figure 3:
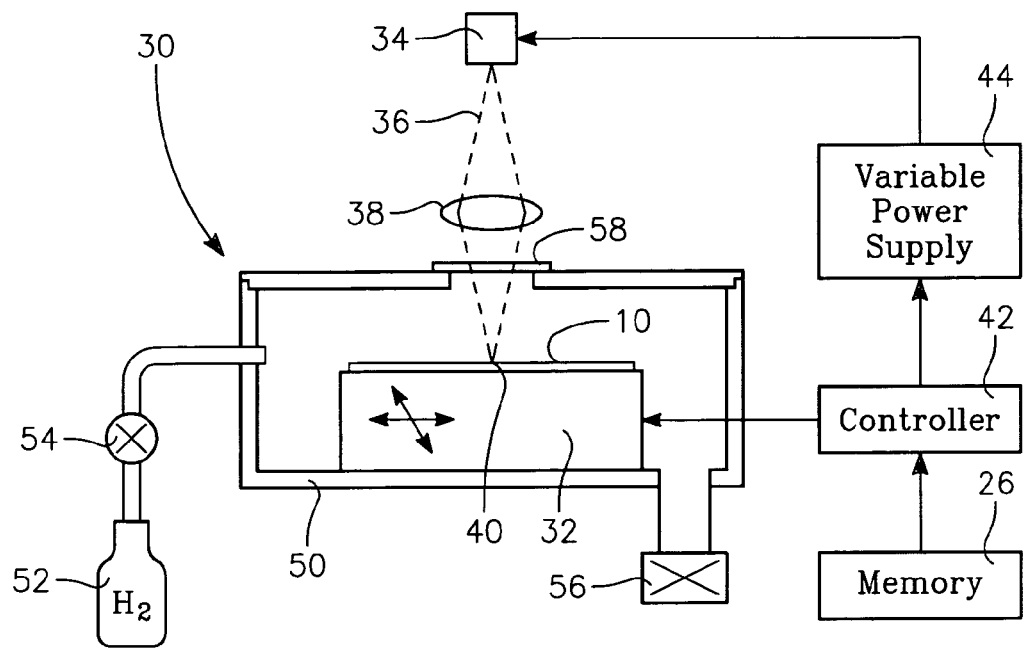
FIG. 3 is a schematic cross-sectional view of one embodiment of the thermal processing sub-system of FIG. 2.

The thermal treatment apparatus 30 is further illustrated in the schematic cross-sectional view of FIG. 3 and includes a vacuum chamber 50 in which the stage 32 supports the wafer 10. A gas source 52 supplies a processing gas, for example, an etch gas such as $H_2$, into the chamber 50 through a mass flow controller 54. A vacuum pump 56 maintains the vacuum chamber 50 at the requisite pressure and exhausts reacted processing gas and reaction by products. A window 58 which is essentially transparent to the laser radiation is sealed to the vacuum chamber 50 over the stage 32 so that the laser beam 36 is produced and focused by elements exterior to the vacuum chamber 50 into the line beam 40 on the surface of the wafer 10 as it is being scanned within the vacuum chamber 50.

The thermal treatment apparatus 30 is capable of etching the silicon material by the etching gas in a thermally activated process relying upon the intense line beam 40. The etching gas flows across the face of the wafer 10 but, outside of the area of the line beam 40, the wafer temperature is too low to activate the etch reactions, for example, $H_2$ converting Si into volatile $SiH_4$. That is, away from the line beam 40, the etch gas does not react with silicon and does not etch the wafer 10. However, the thermal heat pulse produced by the scanned line beam 40 raises a small area of the wafer 10 to above the thermal activation threshold and that small area of the wafer 10 is etched. The etch gas is not limited to $H_2$ and other gases such as $Cl_2$, HCl, $C_2F_6$, and other gases known to etch silicon may used be individually or in combination to selectively thin the silicon layer.

The apparatus may be applied in a feed forward fashion to selectively etch the silicon layer to produce a more uniform layer. Because the wafer 10 was properly aligned on both the scanning ellipsometer 22 and on the stage 32 of the thermal treatment apparatus, the controller 42 can utilize the thickness map stored in the memory 26 to determine how much etching is required for the area of the wafer 10 currently irradiated by the line beam 40 to reduce its thickness to the desired uniform value. The controller 42 can increase the etch rate for overly thick areas by increasing the power delivered to the laser source 34 by the variable power supply 44. It is also possible to operate with constant power delivered to the laser source 34 but to selectively attenuate or deflect the laser beam. Alternatively, the controller 42 can instruct the stage 32 to reduce the scan speed along the fast axis. For areas of the wafer 10 which the thickness map indicates are not so thick, the controller 42 can reduce the laser power or increase the scan speed. In yet another embodiment, the controller 66 may control the etch mass flow controller 54 to either turn on and off the etching gas or to vary its supply quantity or to control the pump system 56 to control the presence of etch gas in the chamber, both of which affect the etching rate.

It is appreciated that the process needs to be normalized by determining which area of the wafer has the thickest silicon layer, which thickness dictates the maximum etching rate. Furthermore, the process needs to be based on a desired uniform final thickness, which can be no thicker than the minimum thickness stored in the thickness map.

Although the feed forward measurement and etching system 20 are illustrated as an integrated system, the measurement system 22 and the etching system 30 may be at different locations. It is understood that the memory 26 represents a body of data and is not tied to a particular storage medium or media. A recorded disk can be transferred from the ellipsometer 22 to the controller 42 of the thermal treatment apparatus 30. The data may be transferred over a communications network or other electrical connection. It is not necessary that a wafer whose thickness is measured by the measurement system 22 be immediately etched in the scanning thermal treatment apparatus 30. For example, a large number of wafers may have their thickness profiles measured and these data are stored together with an identification of the wafer. Thereafter, the batch of wafers are sequentially and selectively etched in the scanning thermal treatment apparatus 30 according to the thickness map identified to the current wafer being etched.

Figure 4:
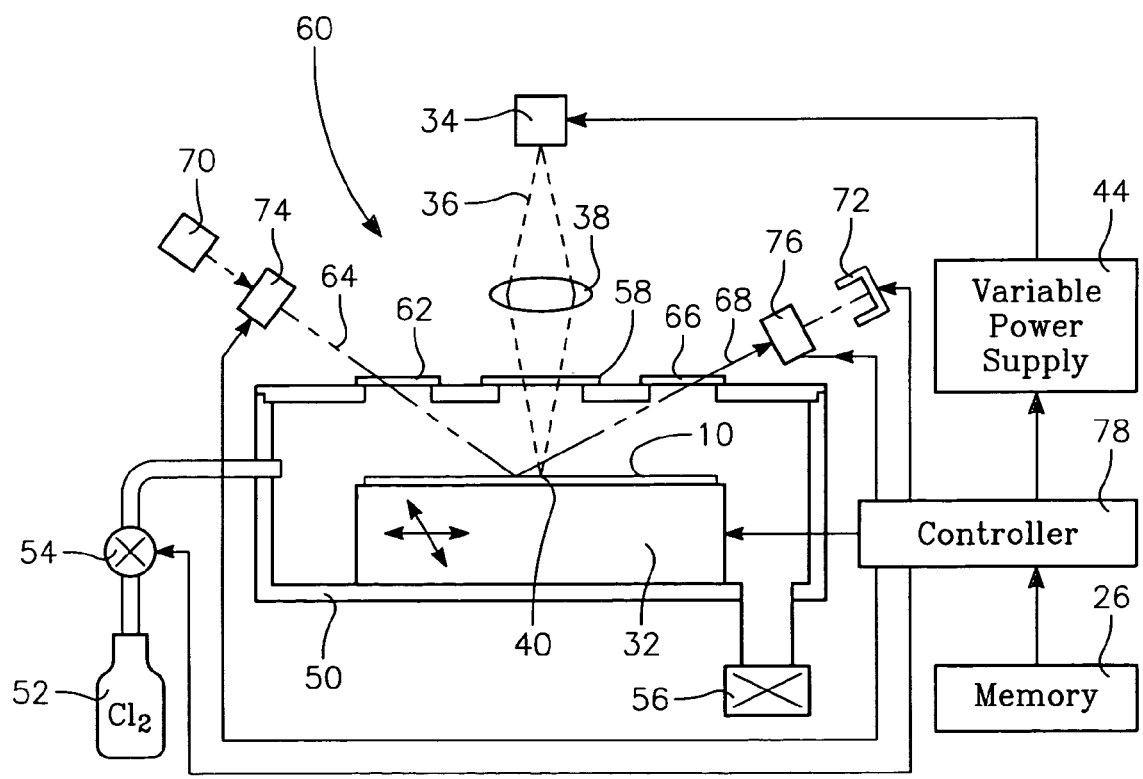
FIG. 4 is a schematic cross-sectional view of an integrated system for mapping a thickness distribution and for thermally processing it.

It is possible to combine the ellipsometer and thermal treatment apparatus in an in-situ or even real-time measurement and selective thinning apparatus 60 illustrated schematically in FIG. 4. An ellipsometer is formed in and around the vacuum chamber 50 having one additional window 62 for a probe beam 64 striking the wafer 10, typically preferably offset from the line beam 40, and yet a further additional window 66 for a reflected beam 68. An optical source 70 produces the probe beam 64 and a detector 72 detects the intensity of the reflected beam 68. Ellipsometer input optics 74 and output optics 76 include the conventional synchronously rotating polarizers and associated electronics and optics required for an ellipsometer. A controller 78 not only controls the variable power supply 44 and the translation stage 32 but also controls the ellipsometer optics 74, 76 and receives the output of the optical detector 72.

The combined apparatus 60 can operate in several modes. In one mode, the ellipsometry equipment included in the combined system 60 can replace the separate scanning ellipsometer 22 of FIG. 2. First, the ellipsometry equipment of the combined system 60 is used in combination with the translation stage 32 to measure the two-dimensional distribution of thickness of the wafer 10 and to store the thickness map in the memory 26. Then, the same wafer 10, without being moved from the stage 32, is subjected to selective thinning in accordance with the measured thickness map and with the supply of the etching gas. This mode may be considered as in-situ ellipsometry.

In another mode, the included ellipsometry equipment may be focused on an area of the wafer 10 about to enter the thermal treatment line beam 40 while the etching gas is etching the wafer area under the line beam 40. The ellipsometer determines the thickness of that area and, with a proper time delay, the controller 78 adjusts the power level of the thermal laser source 34 or the fast-axis scanning speed of the translation stage 32. This mode may be considered as real-time ellipsometry.

In a third mode, the ellipsometry equipment measures the thickness of the wafer 10 after it has been etched, either in real time while the etching continues or after the etching has stopped, and allows the controller 78 to determine if further etching is required. This mode may be considered as in-situ feedback ellipsometry.

Figure 2:
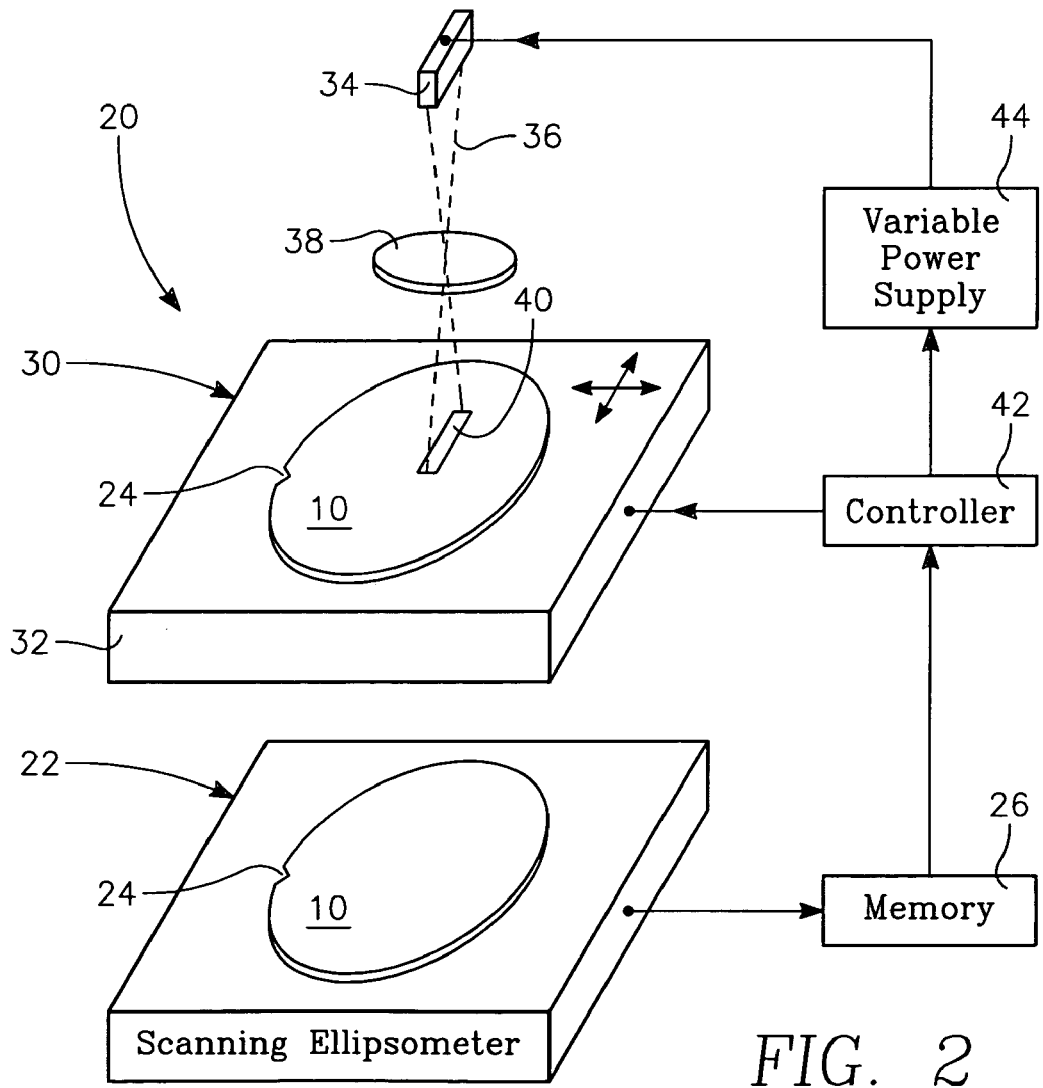
FIG. 2 is a schematic orthographic view of a system including two sub-systems for mapping a thickness distribution on a wafer and thermally processing that wafer according to the mapped thickness.

It is possible to combine the separate scanning ellipsometer 22 of FIG. 2 with the integrated ellipsometer of FIG. 4 to increase throughput and also improve the uniformity.

The ellipsometry may use one or more wavelengths. Alternative to ellipsometry, other types of thickness measuring equipment may be used, such as a map of surface resistivity for a conductive layer. Reflectometry may be used, but is generally less effective for film thickness below 30 nm.

Although the invention has been described in the embodiment of etching a silicon layer in an SOI wafer, it is not so limited. It may be advantageously used for etching silicon or other blanket layers in other types of wafers in which the thickness of the upper layer may easily be determined, for example, a silica layer overlying a nitride or silicon layer. In general, the invention can be applied to any two-dimensionally scanned thermal treatment apparatus.

Figure 5:
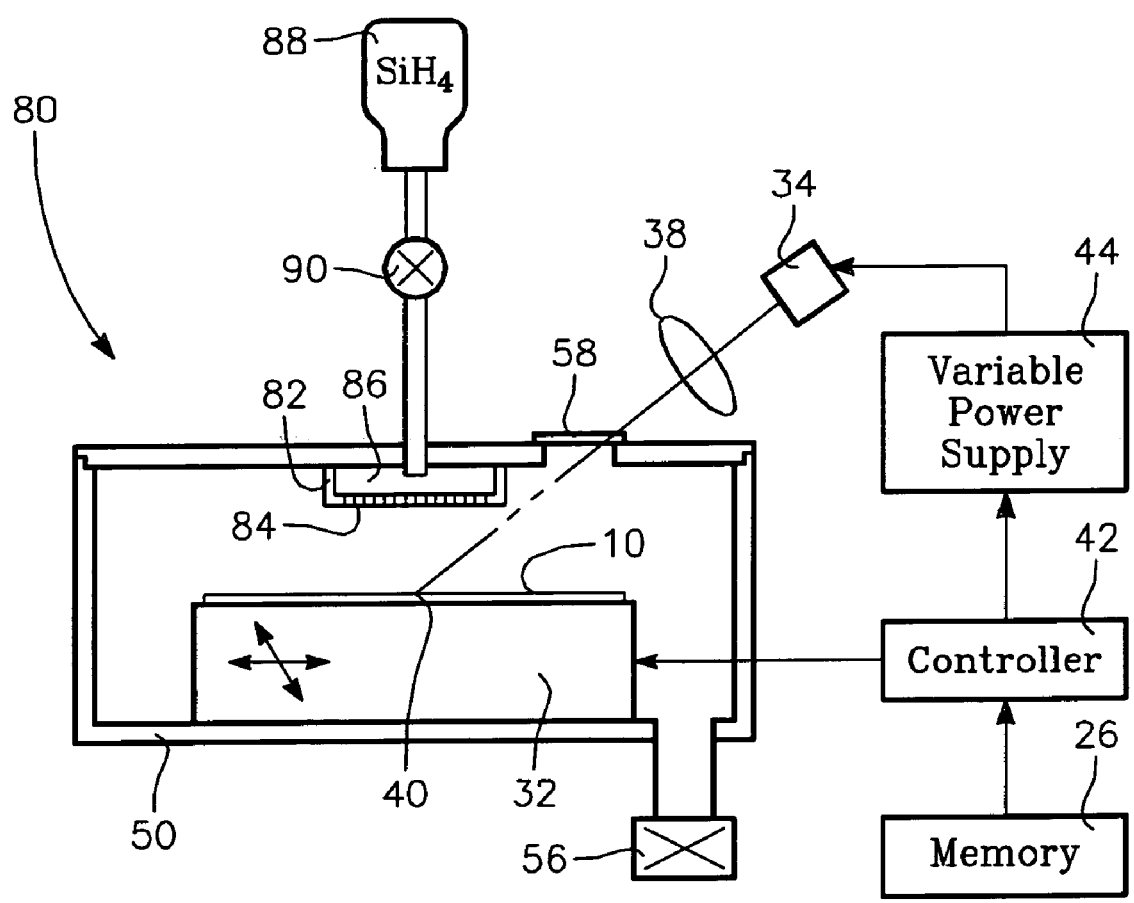
FIG. 5 is a schematic cross-sectional view of an embodiment of the invention including chemical vapor deposition.

Further, the invention may be applied to other types of semiconductor processing, an example being chemical vapor deposition (CVD). As schematically illustrated in FIG. 5, a feed forward thermal scanning CVD system 80 includes a relatively small gas showerhead 82 in opposition to the portion of the wafer 10 including the line beam 40. A number of apertures 84 through the front face of the showerhead 82 communicate the interior of the vacuum chamber 50 to a gas manifold 86. A gas source 88 supplies a CVD precursor gas through a mass flow controller 90 to the gas manifold 86 from which it is uniformly distributed to the area of the wafer 10 around the line beam 40 before being exhausted by the vacuum pumping system 56. An example of a CVD precursor gas is silane ($SiH_4$) used alone or in combination with other gases for the chemical vapor deposition of silicon, silicon dioxide, and silicon nitride. Yet other CVD precursors gases are included within the invention.

In the feed forward control mode with a separate thickness measuring apparatus, the thickness map of the wafer 10 presently aligned on the translation stage 32 is stored in the memory 26. The controller 42 uses the thickness map to control the power supply 44 for the laser source 34 to CVD deposit a selected thickness of the material upon the current position of the wafer 10. Alternatively, the fast-axis scan rate of the stage 32, the amount of precursor gas metered by the mass flow controller 90, or the chamber pressure largely controlled by the vacuum pump system 56 may be selectively controlled on different portions of the wafer 10.

It is possible as well to include the integrated ellipsometer or other thickness measuring device within the CVD system 80 to effect the various modes of operation previously described.

Although the invention has been described in terms of controlling the process according to the thickness of an existing layer, the invention is not so limited. Such lateral variation may be used to account for other variations, for example, process or chamber induced variation.

It is thus seen that the invention provides an unprecedented degree of 2-dimensional control over thickness or other uniformity, whether achieved by etching, deposition or other thermally driven process, not previously achieved. The feed forward control may be implemented with little change of existing equipment and control system. Further, the necessary instrumentation may be integrated with existing equipment without great modification to greatly improve the capabilities of conventional etching and deposition equipment.

The invention claimed is:

1. A thermal processing system, comprising:
   a support for a substrate to be thermally processed;
   a source of electromagnetic radiation;
   optics operatively interposed between the source and the support for producing a localized beam of the electromagnetic radiation upon said substrate;
   a translation mechanism for relative movement of at least a portion of said optics and said support to scan said localized beam along a first axis; and
   a controller varying during a scan of said translation mechanism across said substrate an amount of said electromagnetic radiation delivered to said substrate.

2. The system of claim 1, wherein said localized beam is an elongated beam extending along a second axis perpendicular to said first axis and said translation mechanism additionally provides said relative movement along said second axis.

3. The system of claim 1, wherein the varying causes a variation of radiant energy delivered to different portions of the substrate during the scan to control a degree of thermal processing.

4. The system of claim 1, wherein the variation occurs in middle portions of the scan across the substrate.

5. A thermal processing system, comprising:
   a support for a substrate to be thermally processed;
   a source of electromagnetic radiation:
   optics intermediate the support and the source for producing a localized beam of the electromagnetic radiation upon said substrate;
   a translation mechanism for relative movement of at least a portion of said optics and said support to scan the localized beam along a first axis; and
   a controller controlling an amount of said electromagnetic radiation delivered to said substrate by said beam according to a map of measured thickness of a layer on said substrate,
   wherein the controlling causes a variation of radiant energy delivered to different portions of the substrate during different portions of the scanning.

6. The system of claim 5, wherein said localized beam is an elongated beam extending along a second axis perpendicular to said first axis.

7. The system of claim 6, wherein said translation mechanism is a two-dimensional translation mechanism for providing said relative movement additionally along said second axis and said map is a two-dimensional map.

8. The system of claim 5, further comprising a power supply powering said source and wherein said controller varies an amount of power delivered by said power supply to said source according to said two-dimensional map.

9. The system of claim 5, further comprising a thickness measuring apparatus for measuring thicknesses of said layer and determining said map.

10. The system of claim 9, wherein translation mechanism is a two-dimensional stage supporting said substrate and wherein said thickness measuring apparatus is a scanning ellipsometer.

11. The system of claim 10, wherein said scanning ellipsometer includes said stage.

12. The system of claim 10, wherein said scanning ellipsometer is separate from said translation mechanism.

13. The system of claim 5, further comprising:
a vacuum chamber including said support; and
a source of a processing gas supplied into said vacuum chamber.

14. The system of claim 13, wherein said processing gas is an etching gas.

15. The system of claim 13, wherein said processing gas is a precursor gas for chemical vapor deposition.

16. A scanning thermal processing apparatus, comprising:
a vacuum chamber;
a platform within said vacuum chamber for supporting a substrate to be processed;
an optical source including a laser of a line beam of radiation incident upon said substrate;
a translation mechanism coupled to one of said platform and said optical source to fast scan said line beam in a direction perpendicular to said line beam and to slow scan said line beam in a direction parallel to said line beam; and
a controller including a memory containing a two-dimensional map and controlling an output of said laser according to said map, wherein the output of said laser is controlled to different values during different portions of scanning the line beam across the substrate.

17. The apparatus of claim 16, further comprising a source of etching gas supplied to said vacuum chamber.

18. The apparatus of claim 16, wherein the map is of the substrate upon which said line beam of radiation is incident.

* * * * *